(12) United States Patent
Takemae

(10) Patent No.: US 8,878,571 B2
(45) Date of Patent: Nov. 4, 2014

(54) DRIVER CIRCUIT OF SCHOTTKY TRANSISTOR

(71) Applicant: Transphorm Japan, Inc., Kanagawa (JP)

(72) Inventor: Yoshihiro Takemae, Minato (JP)

(73) Assignee: Transphorm Japan, Inc., Yokohama (JP)

(*) Notice: Subject to any disclaimer, the term of this patent is extended or adjusted under 35 U.S.C. 154(b) by 0 days.

(21) Appl. No.: 14/025,506

(22) Filed: Sep. 12, 2013

(65) Prior Publication Data

US 2014/0084966 A1 Mar. 27, 2014

(30) Foreign Application Priority Data

Sep. 27, 2012 (JP) ................................ 2012-213971

(51) Int. Cl.
*H03B 1/00* (2006.01)
*H03K 3/00* (2006.01)
*H03K 17/687* (2006.01)

(52) U.S. Cl.
CPC ................................ *H03K 17/6877* (2013.01)

USPC ............................ 327/108; 327/109; 327/112

(58) Field of Classification Search
USPC .......................................... 327/108, 109, 112
See application file for complete search history.

(56) References Cited

U.S. PATENT DOCUMENTS 7,310,006 B2 * 12/2007 Shimada .......................... 326/83

FOREIGN PATENT DOCUMENTS

JP  2010-109322 A  5/2010
JP  2011-101217 A  5/2011

* cited by examiner

*Primary Examiner* — John Poos
(74) *Attorney, Agent, or Firm* — Fish & Richardson P.C.

(57) ABSTRACT

A driver circuit includes an output terminal connected to a gate of a Schottky transistor, a reference transistor formed in the same manner as the Schottky transistor, a resistor connected between a first power source line and a gate of the reference transistor, a voltage generator configured to supply a second node with a voltage equal to or lower than a voltage at a first node between the resistor and the reference transistor, and a switching element configured to transmit the voltage at the second node to the output terminal in response to a signal inputted to an input terminal.

3 Claims, 4 Drawing Sheets

DRIVER CIRCUIT OF SCHOTTKY TRANSISTOR

CROSS-REFERENCE TO RELATED APPLICATION

This application is based upon and claims the benefit of priority of the prior Japanese Patent Application No. 2012-213971, filed on Sep. 27, 2012, the entire contents of which are incorporated herein by reference.

FIELD

The embodiments discussed herein are related to a driver circuit of a Schottky transistor.

BACKGROUND

A Schottky GaN transistor, which is a type of a HEMT (high electron mobility transistor), may achieve high output and high-speed operations, and therefore is used in a switching circuit configured to perform switching at a high speed, a power circuit, and the like.
[Patent Document 1] Japanese Laid-open Patent Publication No. 2011-101217
[Patent Document 2] Japanese Laid-open Patent Publication No. 2010-109322

SUMMARY

According to an aspect of the disclosed technique, there is provided a driver circuit of a Schottky transistor including: an input terminal configured to receive an inputted signal; an output terminal connected to a gate of the Schottky transistor; a first power source line; a second power source line having lower potential than the first power source line; a reference transistor formed in the same manner as the Schottky transistor, at least one of a source and a drain of the reference transistor being connected to the second power source line; a resistor connected between the first power source line and a gate of the reference transistor; a voltage generator connected to a first node between the resistor and the gate of the reference transistor and configured to supply a second node with a voltage being equal to or lower than a voltage at the first node; and a switching element configured to transmit the voltage at the second node to the output terminal in response to the signal inputted to the input terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to describing embodiments, a prelude for facilitating understandings of the embodiments will be explained below.

Figure 1:
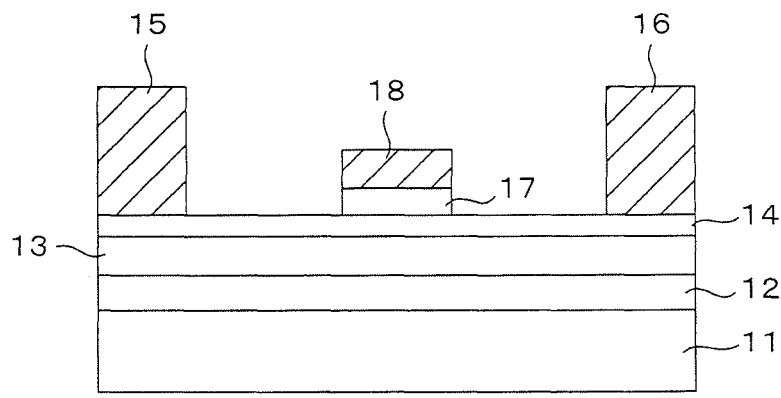
FIG. 1 is a cross-sectional view illustrating an example of a Schottky GaN transistor.

FIG. 1 is a cross-sectional view illustrating an example of a Schottky GaN transistor.

A Schottky GaN transistor illustrated in FIG. 1 includes a substrate 11, a buffer layer 12 formed on the substrate 11, an electron transit layer 13 formed on the buffer layer 12, and an electron supply layer 14 formed on the electron transit layer 13.

A source electrode 15 and a drain electrode 16 are formed away from each other on the electron supply layer 14. A contact layer 17 and a gate electrode 18 are stacked on a portion of the electron supply layer 14 between the source electrode 15 and the drain electrode 16.

The Schottky GaN transistor may use a silicon (Si) substrate, for example, as the substrate 11. The buffer layer 12 is formed by stacking AlN and GaN, for example. Meanwhile, the electron transit layer 13 is made of undoped GaN, while the electron supply layer 14 is made of AlGaN. Further, the contact layer 17 is made of p-type GaN while the source electrode 15, the drain electrode 16, and the gate electrode 18 are made of a metal such as Ni (nickel), Ti (titanium), Al (aluminum), Pt (platinum) or Au (gold).

Figure 2:
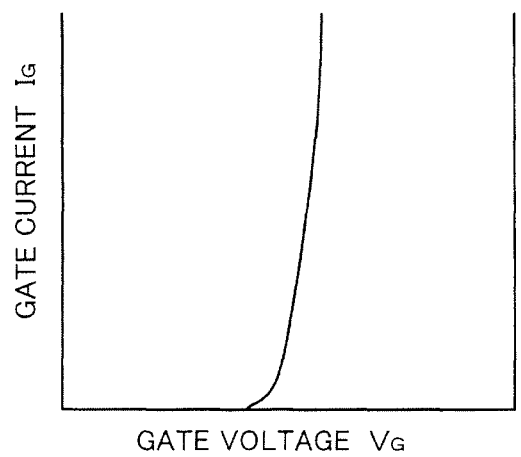
FIG. 2 is a view illustrating a leak current characteristic of the Schottky GaN transistor.

FIG. 2 is a view illustrating a leak current characteristic of the Schottky GaN transistor (hereinafter simply referred to as the "GaN transistor"), in which the horizontal axis indicates a gate voltage $V_G$ and the vertical axis indicates a gate current $I_G$.

In order to reduce on-resistance of the GaN transistor, it is preferable to set the gate voltage $V_G$ as high as possible. However, as illustrated in FIG. 2, the gate current $I_G$ (hereinafter also referred to as a "leak current") flowing from the gate to the source is increased when the gate voltage $V_G$ exceeds a certain voltage. The voltage which triggers such an increase in the gate current $I_G$ is called a breakdown voltage.

Such GaN transistors exhibit relatively large variations in breakdown voltage. For instance, there is a transistor with the breakdown voltage of 8.0 V and there is another transistor with the breakdown voltage of 7.8 V. For this reason, a gate voltage of a GaN transistor is set to a low level with a margin.

However, the setting of the gate voltage to the low level leads to an operation at high on-resistance. Hence, a driving performance of the Schottky GaN transistor is not sufficiently exploited. Moreover, the operation at high on-resistance causes generation of a large amount of heat, which leads to wasting electric power.

Figure 3:
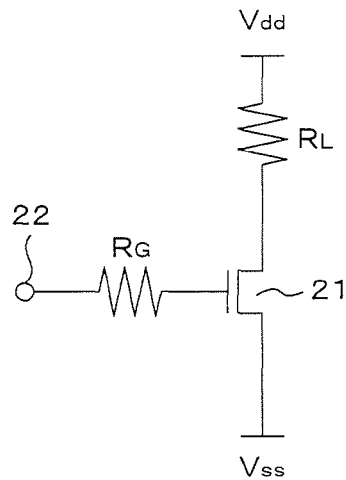
FIG. 3 is a view illustrating an example in which a resistor is connected to a gate of the Schottky transistor in order to suppress a breakdown.

When a resistor $R_G$ is connected between a gate of a GaN transistor 21 and an input terminal (a node) 22 as in FIG. 3, a large leak current flows in the resistor $R_G$ upon occurrence of a breakdown, whereby a voltage drop occurs in accordance with the leak current. Accordingly, upon occurrence of the breakdown, a voltage to be applied to the gate becomes lower than a voltage supplied to the input terminal 22. Note that a resistor R_L in FIG. 3 schematically illustrates a load connected to the GaN transistor 21.

For example, the GaN transistor with the breakdown voltage of 7.8 V and the GaN transistor with the breakdown voltage of 8.0 V are assumed to be used as the GaN transistor 21 in FIG. 3.

When a voltage equal to or above 7.8 V but less than 8.0 V is applied to the input terminal 22, the breakdown occurs in the GaN transistor with the breakdown voltage of 7.8 V, whereby a large amount of the leak current flows in the resistor $R_G$. As a consequence, the gate voltage is reduced by the amount corresponding to the voltage drop caused by the resistor $R_G$ and the breakdown is thus suppressed.

Meanwhile, in the case of the GaN transistor with the breakdown voltage of 8.0 V, no breakdown occurs when the voltage below 8.0 V is applied to the input terminal 22, and the gate voltage becomes equal to the voltage at the input terminal 22.

In other words, an effect equivalent to a reduction in the variations in the breakdown voltage of the GaN transistor 21 may be obtained by connecting the resistor $R_G$ between the input terminal 22 and the gate of the GaN transistor 21.

A resistance value of the resistor $R_G$ is set equal to or higher than a value calculated in accordance with the following formula (I), for example. Here, $V_{G1}$ is a maximum value of the voltage supplied to the resistor $R_G$, $V_{G2}$ is the breakdown voltage ($V_{G1} > V_{G2}$) of the GaN transistor 21, and $I_G$ is the current flowing into the gate upon occurrence of the breakdown.

$$R_G = (V_{G1} - V_{G2})/I_G \quad (1)$$

As described above, by connecting the resistor $R_G$ between the input terminal 22 and the gate of the GaN transistor 21, it may be possible to absorb the variations in breakdown voltage of the GaN transistor 21 and to exploit the driving performance of the GaN transistor 21. In that case, however, a rise of a signal becomes slower due to the resistor $R_G$ functioning as a load and a delay occurs in a switching operation.

The following embodiments describe a driver circuit of a Schottky transistor, which may be capable of exploiting a driving performance of a Schottky transistor and avoiding a delay in switching operation regardless of variations in breakdown voltage.

First Embodiment

Figure 4:
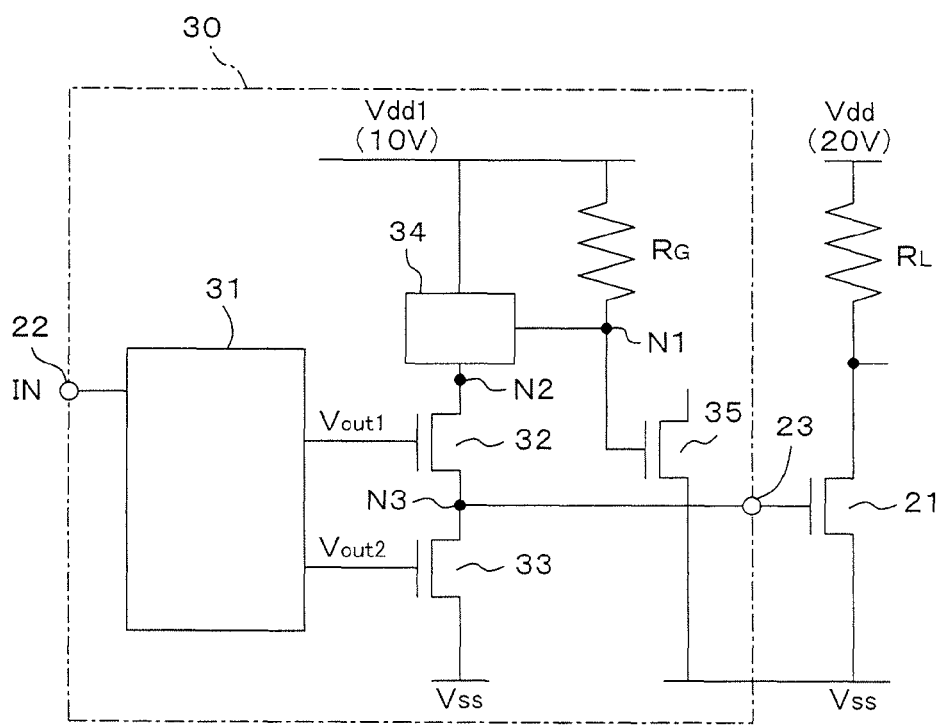
FIG. 4 is a view illustrating a driver circuit of a Schottky transistor according to an embodiment.

FIG. 4 is a view illustrating a driver circuit of a Schottky transistor according to an embodiment.

A driver circuit 30 of a Schottky transistor according to the embodiment includes a drive signal generator 31, MOS transistors 32 and 33, a voltage generator 34, a resistor $R_G$, and a reference transistor 35.

An input terminal 22 is connected to an input side of the drive signal generator 31, and a first drive signal Vout1 and a second drive signal Vout2 are outputted from the drive signal generator 31. The first drive signal Vout1 is transmitted to a gate of the MOS transistor 32 while the second drive signal Vout2 is transmitted to a gate of the MOS transistor 33. A signal IN to be inputted to the input terminal 22 is a signal subjected to pulse width modulation (PWM), for example.

The MOS transistors 32 and 33 are connected in series between a node N2 and a low-potential power source line Vss. Meanwhile, a node N3 between the MOS transistor 32 and the MOS transistor 33 is connected to a gate of a GaN transistor 21 via an output terminal 23. Here, the MOS transistors 32 and 33 are examples of switching elements.

A voltage on a high-potential power source line Vdd1 is set to a voltage higher than a breakdown voltage of the GaN transistor 21. Here, the breakdown voltage of the GaN transistor 21 is set to 8 V while the voltage on the high-potential power source line Vdd1 is set to 10 V.

The voltage generator 34 is connected between the high-potential power source line Vdd1 and the node N2. Meanwhile, the resistor $R_G$ is connected between the high-potential power source line Vdd1 and a node N1.

The node N1 is connected to an input end of the voltage generator 34 and is also connected to a gate of the reference transistor 35. The voltage generator 34 maintains the voltage at the node N2 equal to or slightly below the voltage at the node N1.

The reference transistor 35 is formed in the same manner as the GaN transistor 21. Thus, the reference transistor 35 and the GaN transistor 21 have the same structure. Accordingly, a breakdown voltage of the reference transistor 35 is equal to or substantially equal to the breakdown voltage of the GaN transistor 21. It is preferable to form the reference transistor 35 and the GaN transistor 21 on the same semiconductor chip.

A source of the reference transistor 35 is connected to the low-potential power source line Vss while a drain thereof is open. Here, the drain of the reference transistor 35 may be connected to the low-potential power source line Vss.

In the meantime, a source of the GaN transistor 21 is connected to the low-potential power source line Vss. Meanwhile, a load $R_L$ is connected between a drain of the GaN transistor 21 and a high-potential power source line Vdd. A voltage on the high-potential power source line Vdd is set to 20 V, for example.

In the embodiment, a resistance value of the resistor $R_G$ is determined by the above-mentioned formula (I). Note that the voltage on the high-potential power source line Vdd1 is assigned to $V_{G1}$, the breakdown voltage of the reference transistor 35 is assigned to $V_{G2}$, and a current flowing in the gate of the reference transistor 35 upon occurrence of a breakdown is assigned to $I_G$ in this case.

Figure 5:
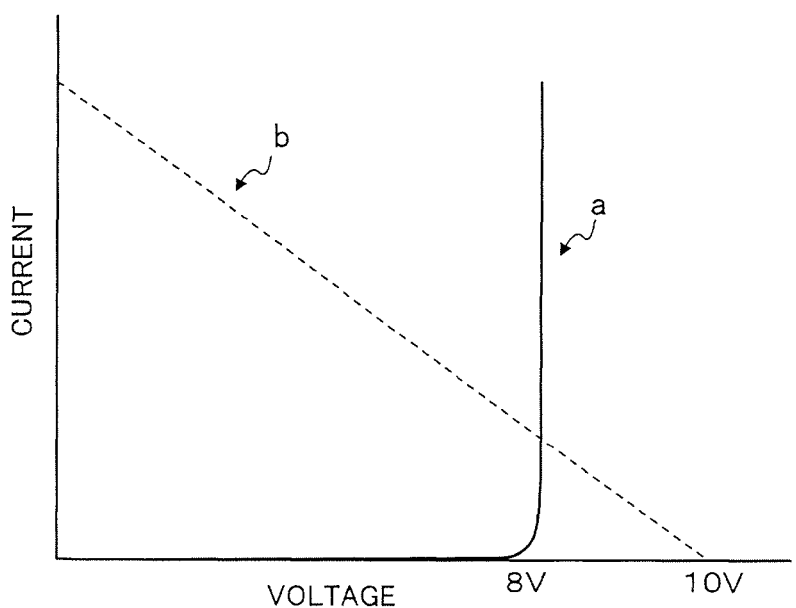
FIG. 5 is a view illustrating a leak current characteristic of a reference transistor and a current-voltage characteristic of a resistor.

FIG. 5 is a view illustrating a leak current characteristic (a solid line a) of the reference transistor 35 and a current-voltage characteristic (a dashed line b) of the resistor $R_G$, in which the horizontal axis indicates the voltage and the vertical axis indicates the current. Here, the breakdown voltage of the reference transistor 35 is assumed to be 8 V.

As indicated with the solid line a in FIG. 5, the gate current on the reference transistor 35 (the GaN transistor) increases when a voltage exceeds the breakdown voltage.

On the other hand, the current flowing in the resistor $R_G$ becomes largest when the voltage at the node N1 is equal to 0 V, and becomes 0 when the voltage at the node N1 is equal to 10 V. Moreover, when the voltage at the node N1 is between 0 V and 10 V, the current linearly changes in accordance with the voltage at the node N1 as indicated with the dashed line b in FIG. 5. In the case of the driver circuit 30 illustrated in FIG. 4, the voltage at the node N1 is held in equilibrium at a point in FIG. 5 where the solid line a intersects the dashed line b.

Figure 6:
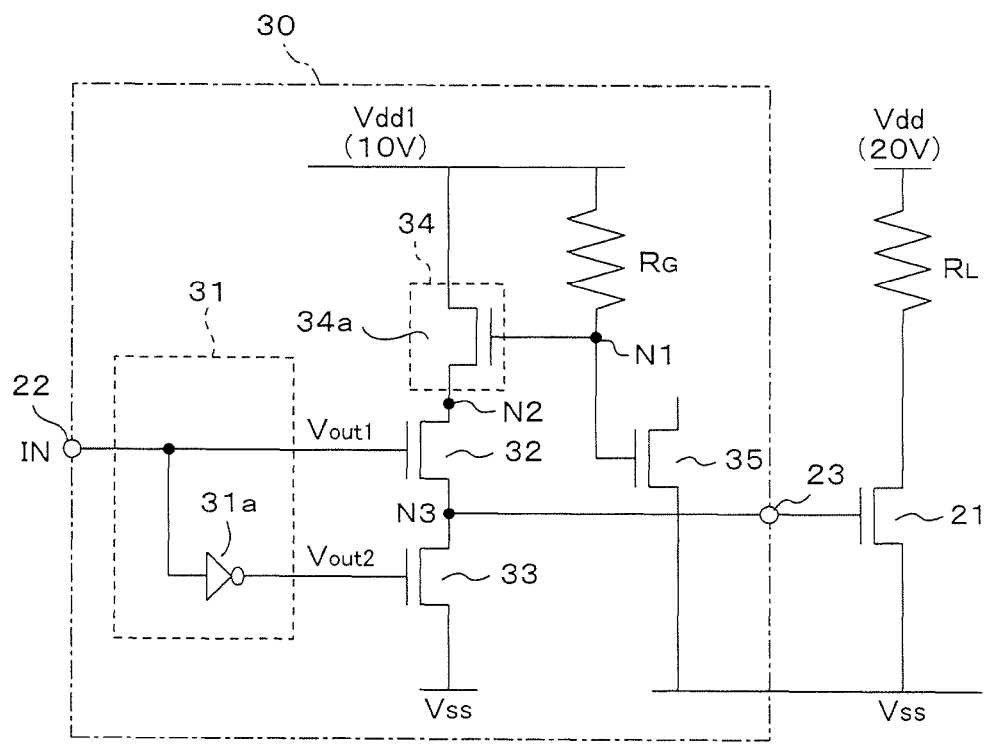
FIG. 6 is a view illustrating a specific example of a drive signal generator and a voltage generator.

FIG. 6 is a view illustrating a specific example of the drive signal generator 31 and the voltage generator 34.

As in FIG. 6, for example, the drive signal generator 31 includes an inverter 31a configured to generate an inverted signal of the inputted signal IN. The signal IN supplied to the input terminal 22 is outputted either directly or through a buffer (not illustrated) or the like as the first drive signal Vout1. Meanwhile, the inverted signal generated by the inverter 31a is outputted as the second drive signal Vout2.

As in FIG. 6, for example, the voltage generator 34 includes a MOS transistor 34a of which a source is connected to the high-potential power source line Vdd1, a drain is connected to the node N2, and a gate is connected to the node N1. When a threshold voltage of the MOS transistor 34a is denoted as Vth, the voltage at the node N2 becomes lower by the threshold voltage Vth than the voltage at the node N1.

Operations of the driver circuit 30 of a Schottky transistor according to the embodiment will be described below.

As described previously, the voltage supplied to the high-potential power source line Vdd1 is the voltage higher than the breakdown voltage of the reference transistor 35. For this reason, the reference transistor 35 breaks down if a given voltage (10 V) is supplied to the high-potential power source line Vdd1.

However, as described with reference to FIG. 4, when the reference transistor 35 breaks down, the large current flows in the resistor $R_G$ and the gate voltage of the reference transistor 35 is reduced by the amount corresponding to the voltage drop caused by the resistor $R_G$, whereby the breakdown is suppressed and the reference transistor 35 is held in equilibrium.

As described previously, the voltage at the node N2 is maintained by the voltage generator 34 at the voltage equal to or slightly below the voltage at the node N1. The voltage at the node N2 will be hereinafter referred to as V'.

Here, when the signal IN inputted to the input terminal 22 is at a level "H", the first drive signal Vout1 outputted from the drive signal generator 31 is at the level "H" and the second drive signal Vout2 outputted from the drive signal generator 31 is at a level "L". Accordingly, the MOS transistor 32 is turned on while the MOS transistor 33 is turned off. As a consequence, the voltage V' is applied to the gate of the GaN transistor 21 via the MOS transistor 32 and the GaN transistor 21 is turned on.

The voltage V' is the voltage which may suppress the breakdown of the reference transistor 35, and the breakdown voltage of the reference transistor 35 is almost equal to that of the GaN transistor 21. For this reason, the GaN transistor 21 does not break down if the voltage V' is applied to the gate of the GaN transistor 21.

Meanwhile, no elements such as resistors which may cause signal delays are present between the input terminal 22 and the gate of the GaN transistor 21 or between the node N2 and the GaN transistor 21. As a consequence, the GaN transistor 21 is turned on substantially at the same time as the rise of the inputted signal IN and there is very little delay in the switching operation.

On the other hand, when the signal IN supplied to the input terminal 22 is set to the level "L", the MOS transistor 32 is turned off while the MOS transistor 33 is turned on. Thus, the gate voltage of the GaN transistor 21 becomes equal to the voltage (0 V) of the low-potential power source line Vss, whereby the GaN transistor 21 is turned off.

As described above, in this embodiment, the voltage V' which may suppress the breakdown of the GaN transistor 21 is generated by using the resistor $R_G$, the reference transistor 35, and the voltage generator 34. Accordingly, it may be possible to avoid occurrence of a breakdown and to exploit the driving performance of the GaN transistor 21 regardless of the variations in breakdown voltage.

Moreover, in this embodiment, the GaN transistor 21 may perform high-speed switching since no elements such as resistors which may cause signal delays are present between the input terminal 22 and the gate of the GaN transistor 21.

As described previously, the GaN transistor may be formed by using a silicon substrate. Accordingly, the GaN transistor (as well as the reference transistor), the MOS transistors, and other elements such as the resistors may be formed on the same silicon substrate and integrated on one chip. In this case, it may be possible to reduce the number of components and costs of an electronic device using the GaN transistor, and to reduce distances between the elements. As a consequence, additional effects including a reduction in parasitic impedance and a reduction in ringing at the time of switching may be expected.

Second Embodiment

Figure 7:
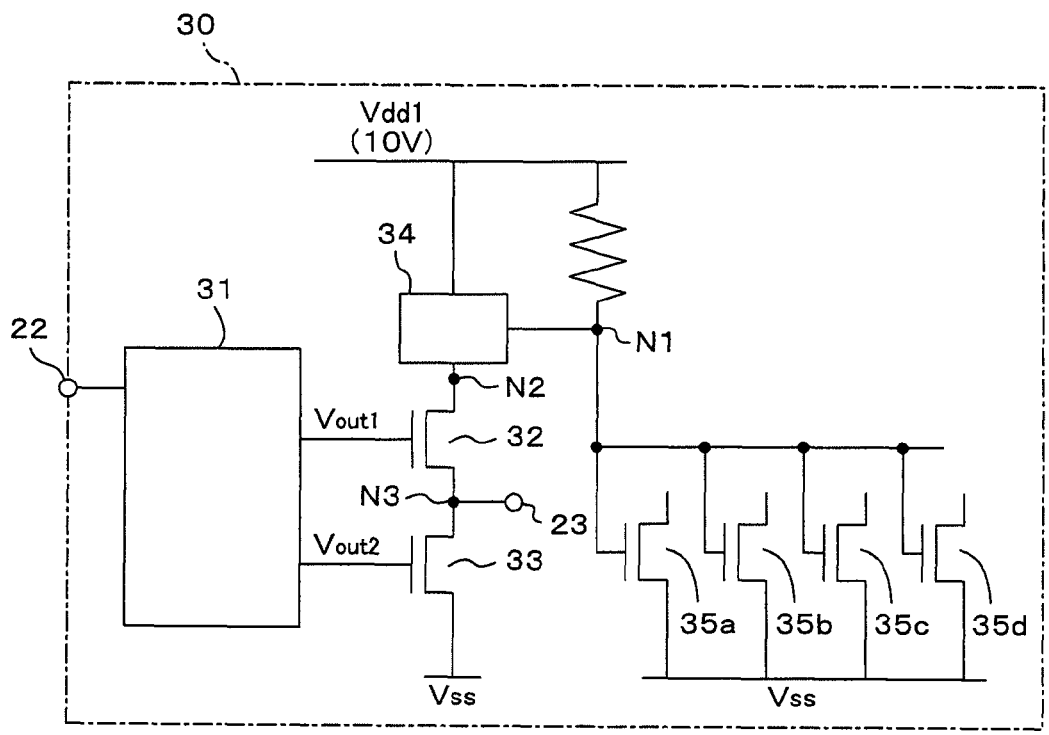
FIG. 7 is a view illustrating a driver circuit of a Schottky transistor according to a second embodiment.

FIG. 7 is a view illustrating a driver circuit of a Schottky transistor according to a second embodiment. In FIG. 7, the same constituents as those in FIG. 4 are denoted by the same reference numerals and detailed description thereof will be omitted. Note that illustration of the GaN transistor 21 and the load $R_L$ in FIG. 4 is omitted in FIG. 7.

As illustrated in FIG. 7, this embodiment includes four reference transistors 35a, 35b, 35c, and 35d. Gates of the reference transistors 35a, 35b, 35c, and 35d are connected to a node N1, and sources thereof are connected to a low-potential power source line Vss. Meanwhile, drains of the reference transistors 35a, 35b, 35c, and 35d are open.

Figure 8:
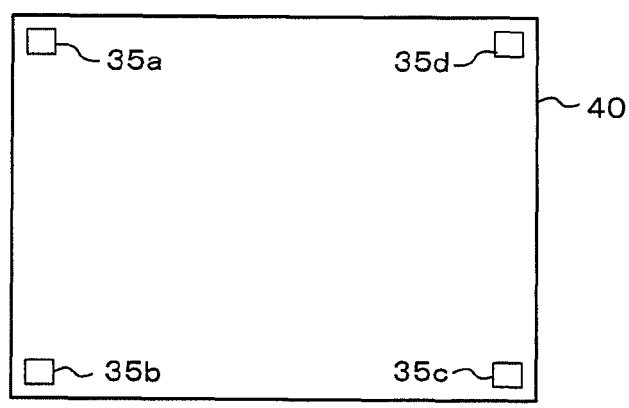
FIG. 8 is a view illustrating an example of forming a GaN transistor and a driver circuit in the same semiconductor chip, which is a view depicting a state of four reference transistors being placed in four corners of the semiconductor chip.

Each of the reference transistors 35a, 35b, 35c, and 35d has the same structure as the GaN transistor 21. Here, the reference transistors 35a, 35b, 35c, and 35d as well as the GaN transistor 21 are formed on the same substrate, and the GaN transistor 21 and the driver circuit are integrated on one chip. In addition, as illustrated in FIG. 8, the reference transistors 35a, 35b, 35c, and 35d are placed in four corners of a semiconductor chip 40 on which the driver circuit 30 is formed.

For this reason, the break down voltage of the GaN transistor 21 is expected to be within a range of the lowest value and the highest value of breakdown voltages of the reference transistors 35a, 35b, 35c, and 35d.

When a given voltage (10 V) is supplied to a high-potential power source line Vdd1, the reference transistor having the lowest breakdown voltage among the reference transistors 35a, 35b, 35c, and 35d becomes the first to break down. Then, the same current as the current flowing in the reference transistor having broken down flows in a resistor $R_G$, and a voltage at the node N1 is thus determined.

When the inputted signal IN is at the level "H", the voltage applied to the gate of the GaN transistor 21 is a voltage equal to or slightly below the voltage at the node N1. Moreover, as described above, the voltage at the node N1 is determined in this embodiment depending on the reference transistor having the lowest breakdown voltage among the reference transistors 35a, 35b, 35c, and 35d formed in the four corners of the semiconductor chip 40. For this reason, this embodiment may prevent a breakdown of the GaN transistor more reliably than the first embodiment.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A driver circuit of a Schottky transistor comprising:
an input terminal configured to receive an inputted signal;

an output terminal connected to a gate of the Schottky transistor;
a first power source line;
a second power source line having lower potential than the first power source line;
a reference transistor formed in a same manner as the Schottky transistor, at least one of a source and a drain of the reference transistor being connected to the second power source line;
a resistor connected between the first power source line and a gate of the reference transistor;
a voltage generator connected to a first node between the resistor and the gate of the reference transistor and configured to supply a second node with a voltage being equal to or lower than a voltage at the first node; and
a switching element configured to transmit the voltage at the second node to the output terminal in response to the signal inputted to the input terminal, wherein
the voltage generator is made of a MOS transistor,
a source of the MOS transistor is connected to the first power source line,
a drain of the MOS transistor is connected to the second node, and
a gate of the MOS transistor is connected to the first node.

2. A driver circuit of a Schottky comprising:
an input terminal configured to receive an inputted signal;
an output terminal connected to a gate of the Schottky transistor;
a first power source line;
a second power source line having lower potential than the first power source line;
a plurality of reference transistors placed away from one another on one semiconductor chip and formed in a same manner as the Schottky transistor, at least one of a source and a drain of the reference transistors being connected to the second power source line;
a resistor connected between the first power source line and a gate of the reference transistors;
a voltage generator connected to a first node between the resistor and the gate of the reference transistor and configured to supply a second node with a voltage being equal to or lower than a voltage at the first node; and
a switching element configured to transmit the voltage at the second node to the output terminal in response to the signal inputted to the input terminal.

3. A driver circuit of a Schottky transistor comprising:
an input terminal configured to receive an inputted signal;
an output terminal connected to a gate of the Schottky transistor;
a first power source line;
a second power source line having lower potential than the first power source line;
a reference transistor formed in a same manner as the Schottky transistor, at least one of a source and a drain of the reference transistor being connected to the second power source line;
a resistor connected between the first power source line and a gate of the reference transistor;
a voltage generator connected to a first node between the resistor and the gate of the reference transistor and configured to supply a second node with a voltage being equal to or lower than a voltage at the first node; and
a switching element configured to transmit the voltage at the second node to the output terminal in response to the signal inputted to the input terminal, wherein a resistance value $R_G$ of the resistor is set to a value equal to or greater than a value obtained by a formula $R_G=(V_{G1}-V_{G2})/I_G$, where $V_{G1}$ is a voltage on the first power source line, $V_{G2}$ is a breakdown voltage of the reference transistor, and $I_G$ is a current flowing into the gate of the reference transistor via the resistor upon occurrence of a breakdown.

* * * * *